United States Patent
Dress et al.

(10) Patent No.: US 6,512,207 B1
(45) Date of Patent: Jan. 28, 2003

(54) APPARATUS AND METHOD FOR THE TREATMENT OF SUBSTRATES

(75) Inventors: Peter Dress, Bruchsal (DE); Uwe Dietze, Austin, TX (US); Jakob Szekeresch, Schönberg (DE); Robert Weihing, Muhlacker (DE)

(73) Assignee: Steag HamaTech AG (DE)

( * ) Notice: Subject to any disclaimer, the term of this patent is extended or adjusted under 35 U.S.C. 154(b) by 0 days.

(21) Appl. No.: 09/914,113

(22) PCT Filed: Feb. 2, 2000

(86) PCT No.: PCT/EP00/00816

§ 371 (c)(1),
(2), (4) Date: Aug. 23, 2001

(87) PCT Pub. No.: WO00/51170

PCT Pub. Date: Aug. 31, 2000

(30) Foreign Application Priority Data

Feb. 22, 1999 (DE) .......................... 199 07 497

(51) Int. Cl.[7] .................................. F27B 5/14
(52) U.S. Cl. .............. 219/390; 219/405; 219/413; 219/492; 118/728; 118/724; 165/80.2; 165/80.4
(58) Field of Search .................. 219/390, 405, 219/411, 413, 444.1, 443.1, 446.1, 492; 118/724, 725, 728, 729, 730, 50.1; 392/416, 418; 165/80.2, 80.4

(56) References Cited

U.S. PATENT DOCUMENTS 5,635,409 A * 6/1997 Moslehi .................... 438/7
5,715,361 A     2/1998 Moslehi
5,740,016 A * 4/1998 Dhindsa .................... 361/704
5,802,856 A * 9/1998 Schaper et al. ............ 62/3.7

FOREIGN PATENT DOCUMENTS

EP    0 418 541 A2    3/1991
JP    58-159329    *    9/1983

OTHER PUBLICATIONS

Abstract of Japan, 58159329, dated Sep. 21, 1983.
Abstract of Japan, 4-239120, dated Aug. 27, 1992.
Abstract of Japan, 10050717 A, dated Feb. 20, 1998.

* cited by examiner

*Primary Examiner*—Teresa Walberg
*Assistant Examiner*—Shawntina T. Fuqua
(74) *Attorney, Agent, or Firm*—R W Becker & Associates; R W Becker

(57) ABSTRACT

A device and method for thermally treating substrates. A substrate is heated by a heating plate to improve thermal homogeneity. The heating plate is heated using a number of separately controlled heating elements. The temperature of the heating elements is measured and the heating process is controlled by a PID controller. In addition, the temperature of the substrate surface facing away from the heating plate is locally measured. The temperature distribution over the substrate surface is determined according to the measured temperatures and set values for the temperature of the individual heating elements are determined and transmitted to the PID controller.

19 Claims, 4 Drawing Sheets

APPARATUS AND METHOD FOR THE TREATMENT OF SUBSTRATES

BACKGROUND OF THE INVENTION

The present invention relates to apparatus and methods for the thermal treatment of substrates, and includes a heating plate and a localizing temperature measuring device that is directed upon a surface of the substrate that faces away from the heating plate.

Such apparatus are used, for example, in the semiconductor industry in connection with processes for coating substrates, especially photo masks, in order to thermally treat the substrates for the curing and chemical pre-treating of the layers. During the thermal treatment, it is important for the subsequent usability of the substrates that the applied layers are treated as uniformly and homogeneously as possible. However, in this connection the problem occurs that due to an increased thermal radiation, a uniform thermal treatment in the corner regions of right-angled substrates, or the rim regions of round substrates, it is not possible to ensure a uniform treatment.

JP-A-04-239120 discloses an apparatus for the thermal treatment of substrates using a heating plate that is heated by a single heating spiral that can be differently controlled in segments thereof. The apparatus further has a localizing temperature measuring device that is directed upon the surface of the substrate that faces away from the heating plate. However, such an apparatus has the problem that it is not possible to ensure a uniform thermal treatment of the substrate. In particular, this apparatus has the problem that the individual segments of the heating spiral are frequently overloaded since the heating effect on the substrate caused by the heating spiral is sensed only with a delay by the localizing temperature measuring device. Therefore, the actually required heating temperature is constantly overshot or undershot due to the different segments of the heating spiral.

JP-A-01-050717 shows an apparatus for the thermal treatment of substrates and includes a lower heating plate, side heating plates, and temperature sensors for measuring the temperature of the heating plates. The temperatures measured by the temperature sensors are conveyed to appropriate control units in order to regulate the heating capacity of the heating plates. Such a control unit, many of which are known in the industry, does not, however, permit an adaptation of the heating device to the substrate temperature and is therefore suitable to only a limited extent for providing a homogeneous thermal treatment.

U.S. Pat. No. 5,715,361 discloses a rapid heating unit for semiconductor wafers. The wafers are heated by heating lamps and the temperature of the wafer is determined by a plurality of pyrometers on the surface of the wafer. As a function of determined temperature values on the wafer surface, the individual heating lamps are controlled. This apparatus has the same problems as occur with that of JP-A-04-239120.

It is therefore an object of the present invention to provide an improved homogeneity during a thermal treatment of substrates.

SUMMARY OF THE INVENTION

Pursuant to the present invention, the stated objective is realized for an apparatus for the thermal treatment of substrates via a heating plate by the following features: a plurality of separately controllable heating elements on that side of the heating plate remote from the substrate, at least one temperature sensor for sensing the temperature of the heating elements, at least one PID controller that is connected with the heating elements and with the at least one temperature sensor, a localizing temperature measuring device that is directed upon the surface of the substrate that faces away from the heating plate, a computing unit that is connected with the temperature measuring device and that determines the temperature distribution on the surface of the substrate, a process control unit that is connected to the computing unit and that determines desired or set values for the temperature for the individual heating elements as a function of the temperature distribution and further conveys these desired or set values to the PID controller. By means of an apparatus having the aforementioned features, an active adaptation of control parameters of a closed loop control circuit is made possible with the aid of external measurement results so that the substrates are subjected to a homogeneous thermal treatment. From the measured temperature values there results a temperature distribution over the substrate surface, from which the appropriately changed desired or set values for the temperature for the heating elements can be determined. These values are stored in the closed loop control circuit formed by the PID controller, the heating elements and the temperature sensor. As a result, it is possible to set the individual heating elements in such a way that the uniform temperature distribution is achieved within the substrate. In particular, a higher temperature can be prescribed for the heating elements in the problematic rim and edge regions.

To prevent a thermal induction disturbance between the individual heating elements, the heating elements are spaced from one another on that side of the heating plate that is remote from the substrate. In so doing, the heating elements are preferably disposed on projections of the heating plate. The shape and number of heating plates is adapted to the shape of the substrates that are to be treated, so that they advantageously extend along the outer contours of the substrates that are to be treated. To simplify control, all of the heating elements preferably have the same shape and size.

For an optimal setting of the heating elements that take part in the heating of the problematical rim portions, the position of the substrate relative to the heating plate is preferably variable.

Pursuant to one preferred specific embodiment of the present invention, each heating element is provided with a PID controller. The computing unit, the process control unit, and/or the PID controller are preferably combined in a single unit.

Pursuant to a further preferred specific embodiment of the present invention, the temperature measuring device is provided with a scanning device for the sequential scanning of that side of the substrate that faces away from the heating plate, in order to obtain in a straight-forward manner a localized measurement of the temperature of the substrate surface. In this connection, the scanning device is preferably provided with a movable mirror in order to be able to move the field of vision of the temperature measuring device over the substrate surface without the necessity of having to move the entire apparatus back and forth. The temperature measuring device is preferably an infrared (IR) camera.

In one preferred specific embodiment of the apparatus, the substrate is a photo mask.

The object of the present invention is realized with a method for the thermal treatment of substrates, according to which the substrate is heated with a heating plate, and the temperature of that surface of the substrate that faces away from the heatin plate is locally measured, by the following process steps:

heating the heating plate by means of a plurality of separately controllable heating elements, measuring the temperature of the heating elements, regulating the heating process with a PID controller, determining the temperature distribution on the substrate surface as a function of the measured temperatures, determining desired or set values for the temperature for the individual heating elements, and conveying the desired or set values for the temperature to the PID controller. With this method, the already aforementioned advantages of a homogeneous thermal treatment of the substrate are achieved by active feedback. In this connection, the individual heating elements are preferably regulated by means of individually associated PID controllers.

Pursuant to one preferred specific embodiment of the present invention, that side of the substrate that faces away from the heating plate is sequentially scanned during the temperature measurement in order to enable in a straight-forward manner a localized temperature measurement. In this connection, the scanning is preferably achieved by moving a mirror.

Pursuant to a particularly preferred specific embodiment of the present invention, the temperature of that side of the substrate that faces away from the heating plate is measured with an IR camera. The inventive method is preferably utilized with photo masks.

BRIEF DESCRIPTION OF THE DRAWINGS

The present invention will subsequently be explained with the aid of a preferred specific embodiment in conjunction with the drawings; in the drawings.

DESCRIPTION OF PREFERRED EMBODIMENTS

Figures 1A, 1B:
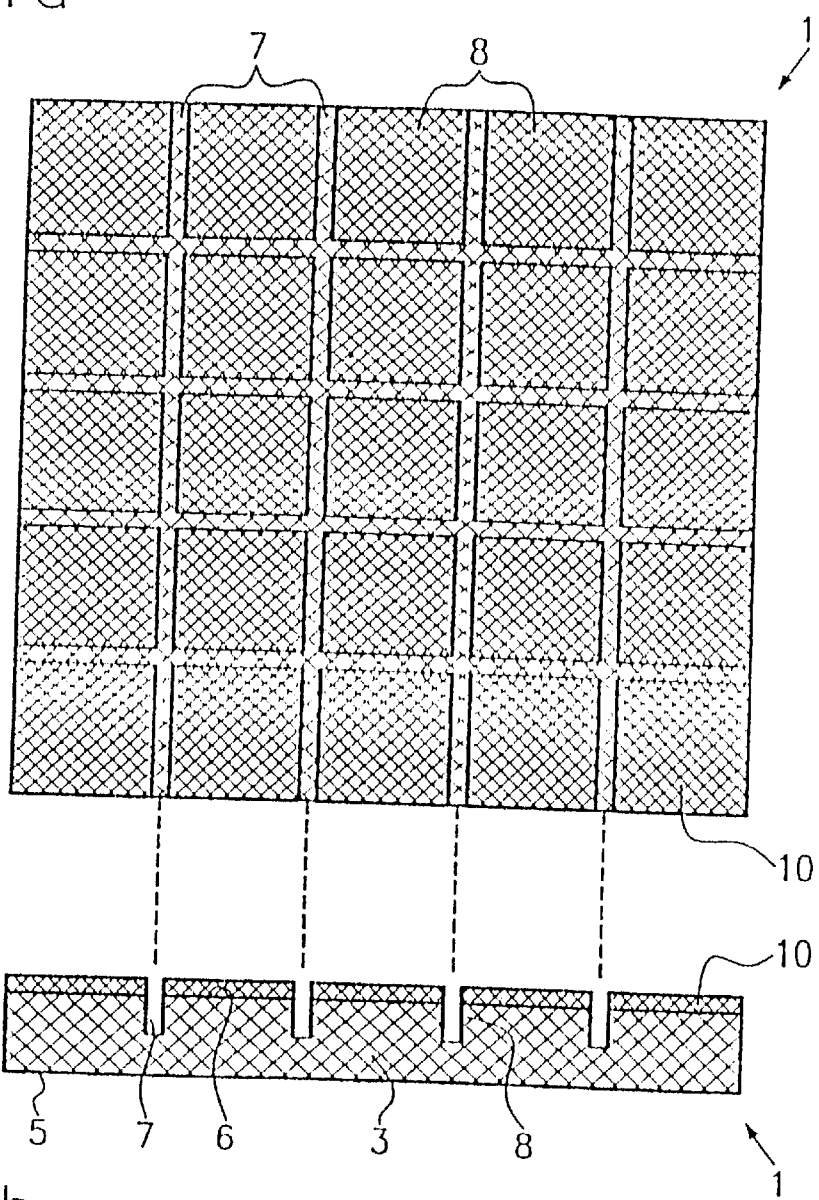
FIG. 1a is a view from below upon a heating plate pursuant to the present invention.
FIG. 1b is a side view of the heating plate.

FIGS. 1a and 1b show a view from below as well as a side view of a zone-controlled heating plate 1 of the present invention.

The heating plate 1 comprises a square base plate 3 that has an essentially rectangular cross-sectional configuration. The base plate 3 has a first planar surface 5 and a second, segmented surface 6. The surface 6 is divided into a total of 25 square segments 8 by means of two groups of four grooves or notches 7 that each extend perpendicular to the side edges of the heating plate. The depth of the grooves 7 is approximately equal to one half of the thickness of the base plate 3. Square heating elements 10 are respectively disposed on the square segments 8 of the heating plate 1; in a suitable manner, such as by gluing, the heating elements are connected with the segments 8 of the base plate 3 and form heating zones that correspond to the base plate 8. By means of the arrangement of the heating elements 10 upon the segments 8 that are respectively separated by the grooves 7, the heating elements are thermally separated from one another so that they do not affect one another, i.e. so that no thermal inductive disturbances occur between the heating elements. However, the heating elements 10 are sufficiently thermally coupled with one another by means of the base plate 3, so that a homogeneous temperature distribution is achieved on the surface 5 of the base plate 3 without a thermal distinction of the individual heating elements in the thermal pattern of the surface 5. Associated with each heating element 10 is a non-illustrated temperature sensor in the form of a thermocouple that measures the actual temperature of the heating elements 10. In place of the thermocouples, it would also be possible to use other temperature sensors, e.g. optical temperature sensors.

Although the heating plate 1 has been described as a one-piece base plate 3, in which grooves 7 are formed for segmenting the outer surface 6 of the base plate 3, it should be noted that the base plate 3 can have an entirely planar configuration, and the heating elements 10 can be connected directly or via spacers with the base plate 3. In the same manner, the present invention is not limited to the shape and number of the segments 8 and of the heating elements 10.

Figure 2:
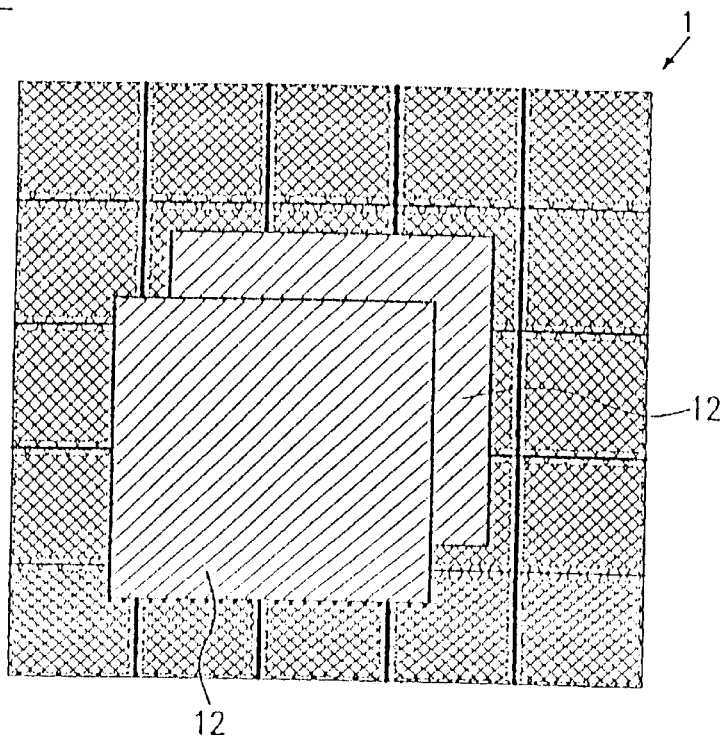
FIG. 2 is a view from above upon the heating plate of FIG. 1 with a substrate disposed thereabove.

FIG. 2 shows a schematic top view of the heating plate 1, whereby the grooves 7 and the heating elements 10, which are not recognizable in the top view, are indicated schematically. Above the heating plate 1, a substrate 12 is illustrated in two different positions relative to the heating plate. In the first, centered position of the substrate 12, the substrate overlaps the central 9 of the total of 25 heating zones of the heating plate 1. Therefore, during a thermal treatment of the substrate, essentially only these 9 zones take part and are of interest. In the second position of the substrate 12, this substrate overlaps at least in part a total of 16 heating zones of the heating plate 1, so that during a thermal treatment of the substrate 12 these 16 heating zones take part and are of interest. From the illustration of these two positions, it is clear that by means of the selection of the position of the substrate, the number of the heating elements that take part during the thermal treatment can be varied and can be optimally adapted.

Figure 3:
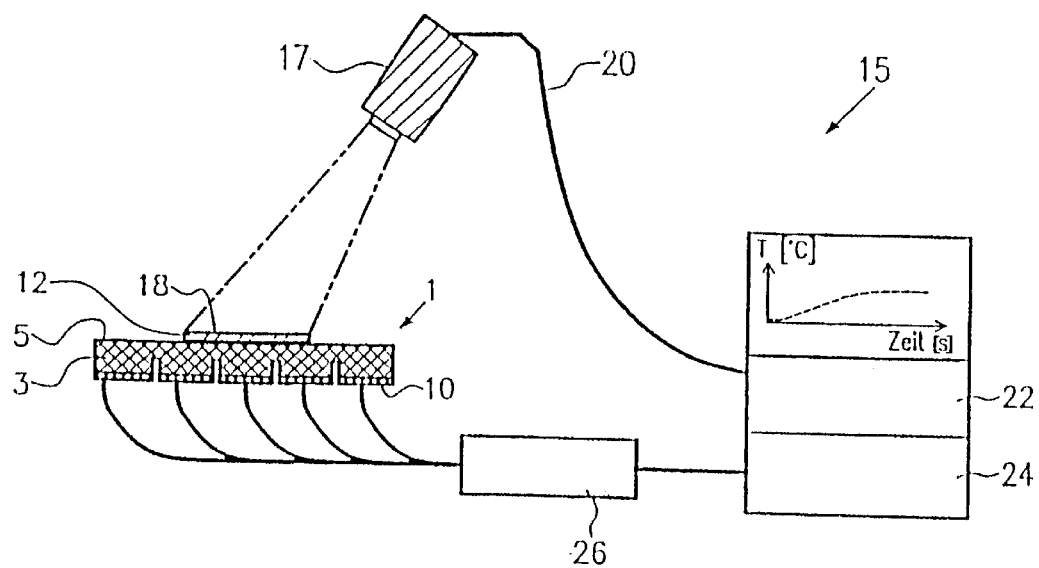
FIG. 3 is a schematic view of the inventive apparatus for the thermal treatment of substrates.

FIG. 3 shows a schematic illustration of an apparatus 15 for the thermal treatment of the substrate 12. The thermal treatment apparatus 15 includes the heating plate 1, illustrated in FIGS. 1 and 2, for the thermal treatment of the substrate 12. The planar outer surface 5 of the base plate 3 of the heating plate 1 is adjacent to a substrate 12 that is to be treated, for example being spaced between 0.1 and 0.5 mm therefrom. The substrate is supported over the heating plate by, for example, four non-illustrated supports. Disposed above the heating plate 1 and the substrate 12 is a temperature measuring device 17 in the form of an infrared camera. The infrared camera 17 is directed upon an surface 18 of the substrate 12 that faces away from the heating plate 1. The infrared camera 17 contains a non-illustrated scanning device having a movable mirror, by means of which the entire surface 18 of the substrate 12 is sequentially scanned. By means of the scanning device, a localized image or pattern of the temperature distribution of the surface 18 of the substrate 12 is produced, whereby the entire surface can be scanned, for example, once each second.

The infrared camera 17 is connected via a data line 20 with a computer in the form of a PC 22. Within the PC, the measured values obtained from the IR camera are processed and a spatial temperature distribution over the surface 18 of the substrate 12 is determined. With the aid of this temperature distribution data, which is further conveyed to a process control 24, desired or set values for the temperature for the heating elements 10 are determined.

These desired or set values for the temperature are conveyed further to a PID controller 26, which is connected with the individual heating elements 10 and the temperature sensors and together with them forms a closed loop control circuit. The PID controller controls the heating capacity of the individual heating elements 10 with the aid of the desired or set values for the temperature prescribed by the process control, and with the aid of the actual temperature values measured by the temperature sensors. Thus, it is acted upon the closed loop control circuit comprising the PID controller 26, the heating elements 10, and the temperature sensors in a specified regulated manner by setting the desired temperature values which are obtained in response to the temperature distribution over the substrate surface. To this extent, there exists a superimposed closed loop control circuit to the closed loop control circuit of the PID controller 26, the heating elements 10, and the temperature sensors. This active regulation (i.e. closed loop control) is carried out during the entire thermal treatment of the substrate 12, in particular also during the heating phase, whereby the individual heating elements are each controlled in such a way that a homogeneous uniform temperature distribution is achieved over the surface 18 of the substrate 12. The individual heating elements are infinitely regulated, for example over a temperature range of 20° to 400° C.

Figure 4:
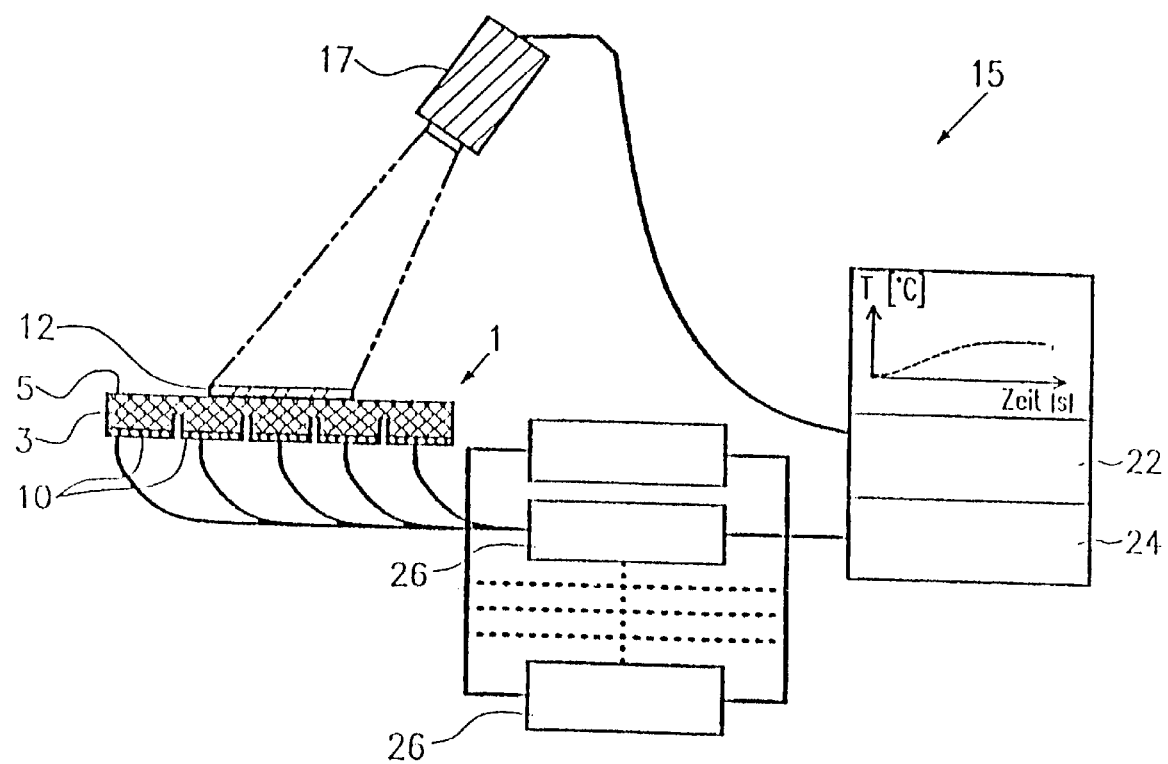
FIG. 4 is a schematic illustration of an alternative specific embodiment of the inventive apparatus for the thermal treatment of substrates.

FIG. 4 shows an alternative embodiment of the apparatus 15, whereby the single difference between the embodiment of FIG. 3 is that each heating element 10 has associated therewith its own PID controller 26.

Figure 5:
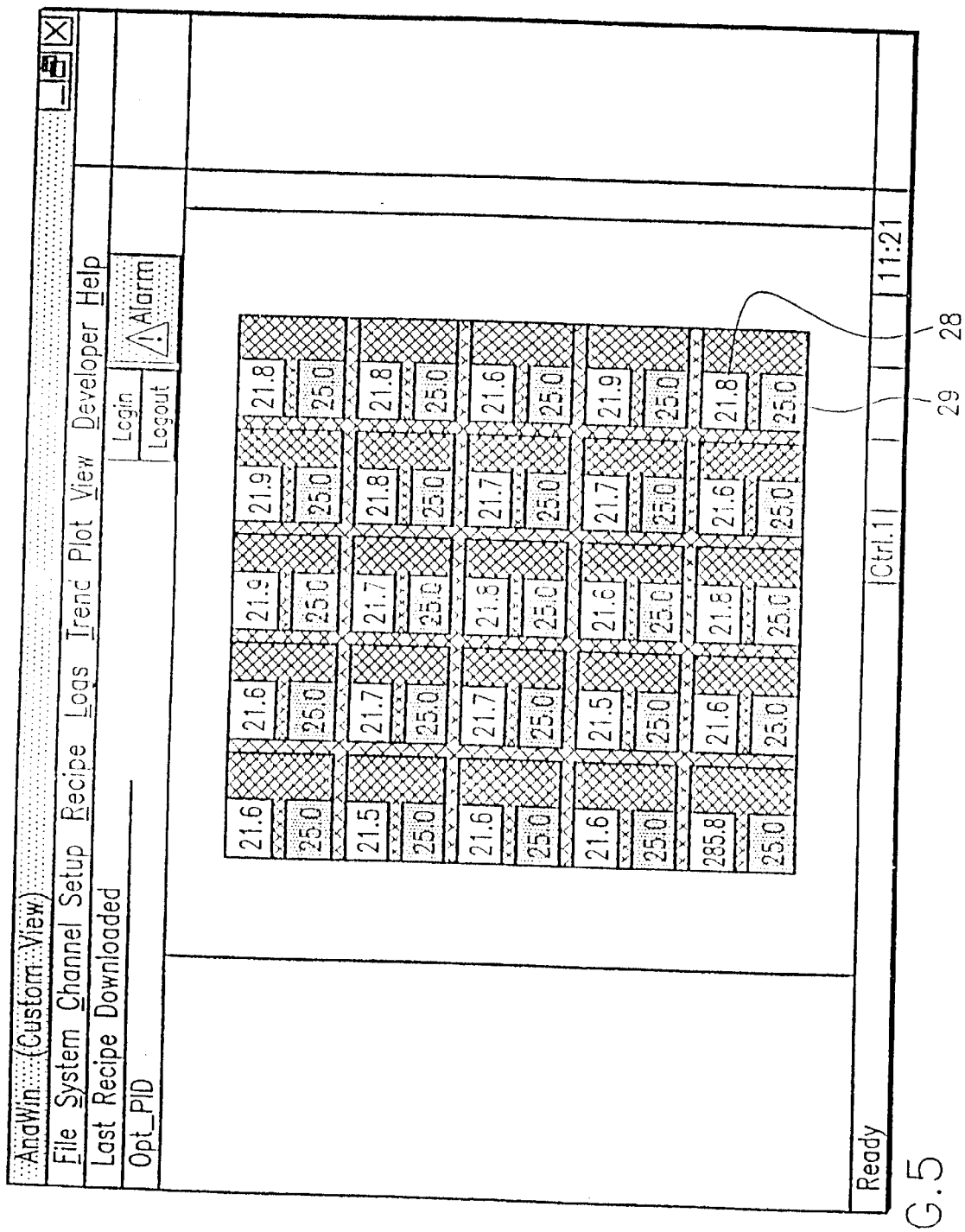
FIG. 5 is a diagrammatic illustration of the heating plate with inserted actual and desired or set values for the temperature of different zones of the heating plate.

FIG. 5 shows a diagrammatic illustration of the heating plate 1, whereby the respectively measured actual temperatures of the heating elements are indicated within a first light box 28. The desired or set values that are respectively prescribed as a function of the temperature distribution upon the surface 18 of the substrate 12 by the process control are indicated in boxes 29 for the individual heating elements.

The present invention has been described in conjunction with a preferred specific embodiment without, however, being limited to such a special design. For example, the heating plate could have a different shape, for example, a round shape, with round heating elements or heating elements that form portions of a circle. Instead of using an infrared camera, it would also be possible to use a different, localizing temperature measuring device. Furthermore, it is also possible to provide the computer, the process control and the PID controller within a single unit.

The specification incorporates by reference the disclosure of German priority document 199 07 497.6 filed Feb. 22, 1999 and International priority document PCT/EP00/00816 filed Feb. 2, 2000.

The present invention is, of course, in no way restricted to the specific disclosure of the specification and drawings, but also encompasses any modifications within the scope of the appended claims.

What is claimed is:

1. An apparatus for the thermal treatment of substrates, comprising:
   a heating plate having a first side for receiving a substrate, and a second side facing away from said first side;
   a plurality of separately controllable heating elements disposed on said second side of said heating plate;
   a localizing temperature measuring device that is directed at a surface of the substrate that faces away from said heating plate;
   at least one temperature sensor for sensing the temperature of said heating elements;
   at least one PID controller connected to said heating elements and said at least one temperature sensor;
   a computing unit that is connected to said temperature measuring device and determines a temperature distribution over said surface of the substrate; and
   a process control unit that is connected to said computing unit and, as a function of said temperature distribution over said surface of the substrate, determines desired or set values for the temperature for individual ones of said heating elements and conveys such desired or set values to said at least one PID controller.

2. An apparatus according to claim 1, wherein said heating elements are spaced from one another on said second side of said heating plate.

3. An apparatus according to claim 2, wherein said heating elements are disposed on projections of said heating plate.

4. An apparatus according to claim 2, wherein said heating elements have a shape and number that is adapted to a shape of a substrate that is to be treated.

5. An apparatus according to claim 4, wherein said heating elements all have the same shape and size.

6. An apparatus according to claim 1, wherein a position of a substrate is variable relative to said heating plate.

7. An apparatus according to claim 1, wherein a respective PID controller is provided for each heating element.

8. An apparatus according to claim 1, wherein at least two of said computing unit, said process control unit, and said at least one PID controller are combined into a single unit.

9. An apparatus according to claim 1, wherein said temperature measuring device is provided with a scanning device for a sequential scanning of a side of the substrate that faces away from the heating plate.

10. An apparatus according to claim 9, wherein said scanning device is provided with a movable mirror.

11. An apparatus according to claim 1, wherein said temperature measuring device is an IR camera.

12. An apparatus according to claim 1, wherein the substrate is a photo mask.

13. A method for the thermal treatment of substrates, including the steps of:
   heating a substrate with a heating plate having a plurality of separately controllable heating elements;
   locally measuring the temperature of a substrate surface that faces away from said heating plate;
   measuring the actual temperature of said heating elements;
   controlling a heating process with at least one PID controller;
   determining a temperature distribution over said substrate surface as a function of measured temperatures;
   determining desired or set values for the temperature of individual ones of said heating elements as a function of said temperature distribution over said substrate surface; and
   conveying said desired or set values for the temperature to said at least one PID controller.

14. A method according to claim 13, wherein individual ones of said heating elements are regulated by individually associated PID controllers.

15. A method according to claim 13, wherein during temperature measurement said substrate surface that faces away from said heating plate is sequentially scanned.

16. A method according to claim 15, wherein sequential scanning is effected by moving a mirror.

17. A method according to claim 13, wherein the temperature of said substrate surface that faces away from said heating plate is measured with an IR camera.

18. A method according to claim 13, wherein the substrate is a photo mask.

19. An apparatus for the thermal treatment of substrates, comprising:

a heating plate having a first side for receiving a substrate, and a second side facing away from said first side;

a plurality of separately controllable heating elements disposed on said second side of said heating plate;

a localizing temperature measuring device that is directed at a surface of the substrate that faces away from said heating plate, said localizing temperature measuring device measuring the temperature of said surface of the substrate;

at least one temperature sensor for sensing the temperature of said heating elements; and means for controlling the temperature of said heating elements in response to both the measured temperature of said surface of the substrate and the sensed temperature of said heating elements, said means for controlling the temperature of said heating elements including at least one PID controller connected to said heating elements and said at least one temperature sensor, a computing unit that is connected to said temperature measuring device and determines a temperature distribution over said surface of the substrate, and a process control unit that is connected to said computing unit and, as a function of said temperature distribution over said surface of the substrate, determines desired or set values for the temperature for individual ones of said heating elements and conveys such desired or set values to said at least one PID controller.

* * * * *

UNITED STATES PATENT AND TRADEMARK OFFICE
CERTIFICATE OF CORRECTION

PATENT NO.    : 6,512,207 B1
DATED         : January 28, 2003
INVENTOR(S)   : Dress et al.

It is certified that error appears in the above-identified patent and that said Letters Patent is hereby corrected as shown below:

<u>Title page,</u>
Item [86], should read as follows:
-- [86] PCT No.:      PCT/EP00/00816
§ 371 Date: August 23, 2001
§ 102(e) Date: August 23, 2001 --

Signed and Sealed this

Third Day of June, 2003

JAMES E. ROGAN
*Director of the United States Patent and Trademark Office*